(12) United States Patent
Ye et al.

(10) Patent No.: US 7,684,462 B2
(45) Date of Patent: Mar. 23, 2010

(54) SYSTEM AND METHOD FOR CONTROLLING VARIATIONS OF SWITCHING FREQUENCY

(75) Inventors: Jun Ye, Shanghai (CN); Zhen Zhu, Shanghai (CN); Shifeng Zhao, Shanghai (CN); Lieyi Fang, Shanghai (CN); Zhiliang Chen, Shanghai (CN)

(73) Assignee: On-Bright Electronics (Shanghai) Co., Ltd., Zhangjiang Hi Tech Park, Shanghai (CN)

( * ) Notice: Subject to any disclaimer, the term of this patent is extended or adjusted under 35 U.S.C. 154(b) by 1338 days.

(21) Appl. No.: 11/102,611

(22) Filed: Apr. 7, 2005

(65) Prior Publication Data

US 2006/0221646 A1  Oct. 5, 2006

(30) Foreign Application Priority Data

Mar. 30, 2005 (CN) ......................... 2005 1 0024849

(51) Int. Cl.
*H04B 1/00* (2006.01)
(52) U.S. Cl. ....................... 375/130; 708/252
(58) Field of Classification Search ................ 375/130, 375/367; 708/250–252
See application file for complete search history.

(56) References Cited

U.S. PATENT DOCUMENTS

| | | | | |
|---|---|---|---|---|
| 3,731,198 A | * | 5/1973 | Blasbalg | ..................... 375/367 |
| 4,136,326 A | * | 1/1979 | Naudot et al. | .................. 367/39 |
| 4,342,119 A | * | 7/1982 | Seidl | .............................. 455/1 |
| 5,122,719 A | * | 6/1992 | Bessenyei et al. | ........... 318/629 |
| 5,243,303 A | * | 9/1993 | Murata et al. | ................. 331/78 |
| 5,686,869 A | * | 11/1997 | Naruse et al. | ................ 332/109 |
| 5,828,333 A | * | 10/1998 | Richardson et al. | ........... 342/70 |
| 6,229,366 B1 | | 5/2001 | Balakirshnan et al. | |
| 6,249,876 B1 | | 6/2001 | Balakirshnan et al. | |
| 6,545,882 B2 | | 4/2003 | Yang | |
| 6,597,298 B2 | * | 7/2003 | Kim et al. | .................... 341/111 |
| 6,674,789 B1 | * | 1/2004 | Fardoun et al. | ............. 375/132 |
| 6,727,765 B1 | * | 4/2004 | Ess | .............................. 331/78 |
| 7,362,191 B2 | * | 4/2008 | Chen et al. | ..................... 331/78 |
| 2004/0090802 A1 | * | 5/2004 | Pourseyed et al. | ............. 363/39 |
| 2004/0183511 A1 | | 9/2004 | Dening | |
| 2006/0170445 A1 | * | 8/2006 | Driscoll | ...................... 324/765 |

FOREIGN PATENT DOCUMENTS

GB       2238201       *  5/1991

* cited by examiner

*Primary Examiner*—Jean B Corrielus
(74) *Attorney, Agent, or Firm*—Jones Day

(57) ABSTRACT

System and method for providing frequency control to a power converter. The system includes a pseudorandom signal generator configured to generate a digital signal. The digital signal is associated with at least an N-bit datum, and N is a positive integer. Additionally, the system includes a digital-to-analog converter configured to receive the digital signal and generate a first control signal, an output signal generator configured to receive the first control signal and generate at least a first output signal associated with a frequency, and a pulse-width-modulation generator configured to receive at least the first output signal. The N-bit datum represents a pseudorandom number.

32 Claims, 5 Drawing Sheets

SYSTEM AND METHOD FOR CONTROLLING VARIATIONS OF SWITCHING FREQUENCY

CROSS-REFERENCES TO RELATED APPLICATIONS

This application claims priority to Chinese Patent Application No. 200510024849.3 (East IP Ref. No. 05NI2173-1365-SMY), filed Mar. 30, 2005, entitled "System and Method for Controlling Variations of Switching Frequency in Power Converters," by Inventors Jun Ye, Zhen Zhu, Shifeng Zhao, Lieyi Fang, and Zhiliang Chen, commonly assigned, incorporated by reference herein for all purposes.

The following two commonly-owned co-pending applications, including this one, are being filed concurrently and the other one is hereby incorporated by reference in its entirety for all purposes:

1. U.S. patent application Ser. No. 11/102,574, in the name of Jun Ye, Zhen Zhu, Shifeng Zhao, Lieyi Fang, and Zhiliang Chen, titled, "System and Method for Adaptive Switching Frequency Control,"; and 2. U.S. patent application Ser. No. 11/102,611, in the name of Jun Ye, Zhen Zhu, Shifeng Zhao, Lieyi Fang, and Zhiliang Chen, titled, "System and Method for Controlling Variations of Switching Frequency,".

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides a system and method for controlling frequency variations. Merely by way of example, the invention has been applied to a power converter. But it would be recognized that the invention has a much broader range of applicability.

Power converters are widely used for consumer electronics such as portable devices. The power converters can convert electric power from one form to another form. As an example, the electric power is transformed from alternate current (AC) to direct current (DC), from DC to AC, from AC to AC, or from DC to DC. Additionally, the power converters can convert the electric power from one voltage level to another voltage level. The power converters include linear converters and switch-mode converters.

The switch-mode converters often need to meet certain requirements on electromagnetic interference (EMI). A single switching frequency and its harmonics can cause EMI problems. To suppress EMI, the switching frequency is often varied by clock jittering for conventional switch-mode power converters.

For example, the clock jittering is generated by an analog circuit for frequency variations. The analog circuit provides a frequency variation signal at a frequency much lower than the switching frequency of the power converter. For example, the switching frequency is in the tens of kilo-Hz range, and the frequency of the frequency variation signal is even lower. Accordingly, the analog circuit often needs a large capacitor area and is expensive to implement.

In another example, the clock jittering is generated by a digital circuit. The digital circuit can use a counter to generate a frequency variation signal. But the frequency variation signal often has a fixed pattern without scrambling. The energy spreading may not be uniform in the frequency band of interest. In yet another example, the frequency variation is controlled by an external signal such as a power supply voltage of an integrated circuit (IC) system. But the range of frequency variation is often limited. Additionally, change of the switching frequency with the power supply voltage often makes the switch-mode power converter difficult to design.

Hence it is highly desirable to improve techniques for controlling frequency variations.

BRIEF SUMMARY OF THE INVENTION

The present invention is directed to integrated circuits. More particularly, the invention provides a system and method for controlling frequency variations. Merely by way of example, the invention has been applied to a power converter. But it would be recognized that the invention has a much broader range of applicability.

According to one embodiment of the present invention, a system for providing frequency control to a power converter is provided. The system includes a pseudorandom signal generator configured to generate a digital signal. The digital signal is associated with at least an N-bit datum, and N is a positive integer. Additionally, the system includes a digital-to-analog converter configured to receive the digital signal and generate a first control signal, an output signal generator configured to receive the first control signal and generate at least a first output signal associated with a frequency, and a pulse-width-modulation generator configured to receive at least the first output signal. The N-bit datum represents a pseudorandom number.

According to another embodiment of the present invention, a system for providing a pseudorandom signal includes a shift register configured to receive a first input signal and a second input signal and generate a digital signal. The shift register includes m flip-flops, and m is a positive integer. Additionally, the system includes a processing device configured to receive a plurality of signals and generate the first input signal. The plurality of signals represent data stored in a plurality of flip-flops respectively, and the plurality of flip-flops are selected from the m flip-flops. Moreover, the system includes a digital-to-analog converter configured to receive the digital signal and generate an analog signal associated with a signal strength. The digital signal represents at least an N-bit datum, and N is a positive integer. The N-bit datum corresponds to N flip-flops, and the N flip-flops is selected from the m flip-flops.

According to yet another embodiment of the present invention, a method for providing frequency control to a power converter includes generating a digital signal. The digital signal is associated with at least an N-bit datum, and N is a positive integer. Additionally, the method includes receiving the digital signal, processing information associated with the digital signal, and generating a first control signal based on at least information associated with the digital signal. The first control signal is an analog signal. Moreover, the method includes receiving the first control signal, processing information associated with the first control signal, and generating at least a first output signal related to a frequency based on at least information associated with the first control signal. The N-bit datum represents a pseudorandom number.

According to yet another embodiment of the present invention, a method for providing a pseudorandom signal includes receiving a plurality of signals from a shift register, processing information associated with the plurality of signals, and generating a first input signal based on at least information associated with the plurality of signals. Additionally, the method includes receiving the first input signal and a second input signal by the shift register, processing information associated with the first input signal and the second input signal, and generating a digital signal based on at least information associated with the first input signal and the second input signal by an M-sequence process. Moreover, the method includes processing information associated with the digital signal, and generating an analog signal related to a signal strength based on at least information associated with the digital signal. The digital signal represents at least an N-bit datum, and N is a positive integer. The N-bit datum represents a pseudorandom number.

Many benefits are achieved by way of the present invention over conventional techniques. For example, some embodiments of the present invention can reduce electromagnetic interference of a switch-mode power converter. For example, the switch-mode converter is an off-line power converter. Certain embodiments of the present invention provide switching frequency variations to a switch-mode power converter. Some embodiments of the present invention avoid a strong single tone at a fixed frequency and the harmonics in a switch-mode power converter. Certain embodiments of the present invention can spread the electromagnetic interference power within a frequency range for a switch-mode power converter. For example, the randomization of the switching frequency can make the EMI power spectrum substantially uniform in a frequency band around a mean switching frequency and the high order harmonics. Some embodiments of the present invention provide frequency variations according to a frequency modulation index $M_f$. For example, the frequency modulation index $M_f$ is determined by the EMI requirement of the switch-mode power converter.

Certain embodiments of the present invention use a digital circuit for frequency variation. The digital circuit is portable, and can be easily migrated for different integrated circuit manufacturing processes. Some embodiments of the present invention provide frequency variations to a clock signal by a pseudorandom signal. For example, the pseudorandom signal is a M-sequence signal. Certain embodiments of the present invention use a frequency variation controller including an m-stage M-sequence generator and an N-bit digital-to-analog converter. For example, the m-stage M-sequence generator includes an m-stage linear shift register. In another example, the digital-to-analog converter operates either in the voltage mode or the current mode. In yet another example, the output of the digital-to analog converter is used to control frequency variations of an oscillator in a switch-mode power converter. In yet another example, the clock signal generated by the oscillator is fed into the linear shift register.

Some embodiments of the present invention use an oscillator controlled by voltage or current signals. For example, the control signals are generated by a frequency variation generator and/or a dead-time controller. In another example, the oscillator generates a clock signal and a ramping signal. The clock signal and the ramping signal do not have a constant frequency. The frequency is randomized and shuffled over time. In yet another example, the charge and discharge current in the oscillator is modulated by a pseudorandom signal. The modulated charge and discharge current determine the oscillation frequency and hence the switching frequency in the switch-mode power converter.

Various additional objects, features and advantages of the present invention can be more fully appreciated with reference to the detailed description and the accompanying drawings that follow.

DETAILED DESCRIPTION OF THE INVENTION

The present invention is directed to integrated circuits. More particularly, the invention provides a system and method for controlling frequency variations. Merely by way of example, the invention has been applied to a power converter. But it would be recognized that the invention has a much broader range of applicability.

Figure 1:
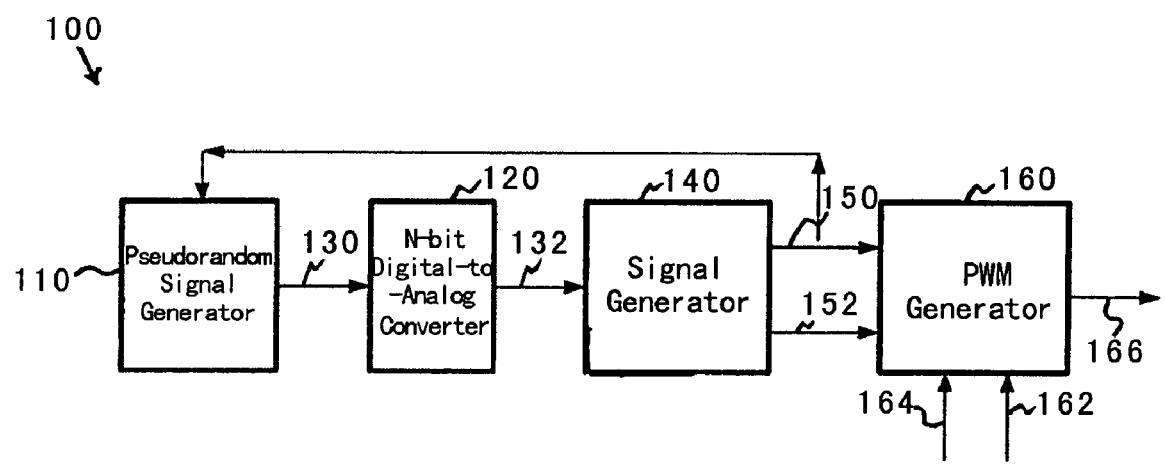
FIG. 1 is a simplified system for controlling frequency variation according to an embodiment of the present invention.

FIG. 1 is a simplified system for controlling frequency variation according to an embodiment of the present invention. This diagram is merely an example, which should not unduly limit the scope of the claims. One of ordinary skill in the art would recognize many variations, alternatives, and modifications. A system 100 includes a pseudorandom signal generator 110, an N-bit digital-to-analog converter 120, a signal generator 140, and a pulse-width-modulation (PWM) generator 160. Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. For example, the PWM generator 160 is replaced by another component receiving at least an output signal of the signal generator 140. Further details of these components are found throughout the present specification and more particularly below.

The pseudorandom signal generator 110 outputs a digital signal 130 to the N-bit digital-to-analog (D/A) converter 120. For example, the pseudorandom signal generator 110 includes an m-stage M-sequence generator. m is a positive integer. In another example, N is a positive integer. The D/A converter 120 generates a control signal 132 based on the digital signal 130. In one embodiment, the control signal 132 is in the current domain. In another embodiment, the control signal is in the voltage domain. For example, the control signal 132 is modulated by the digital signal 130. In another example, the control signal 132 is a pseudorandom signal. In yet another example, the pseudorandom signal generator 110 and the N-bit D/A converter 120 form a clock randomizer.

The control signal 132 is received by the signal generator 140. For example, the signal generator 140 is an output signal generator. The signal generator 140 outputs a clock signal 150 and a ramping signal 152 based on the control signal 132. In one embodiment, the signal generator 140 includes an oscillator. For example, the oscillator is a voltage controlled oscillator (VCO). In another example, the oscillator is a current controlled oscillator (ICO). The oscillation frequency is modulated with respect to time by the control signal 132. For example, the oscillation frequency is randomized around a mean frequency for a predetermined time period.

The clock signal 150 and the ramping signal 152 are received by the PWM generator 160. Additionally, the clock signal 150 is also received by the pseudorandom signal generator 110. In one embodiment, the PWM generator 160 also receives a voltage feedback signal 162 and a current sensing signal 164, and generates a PWM signal 166. For example, the PWM signal 166 is used to turn on or off a power switch in a switch-mode power converter. In another example, the ramping signal 152 is used for slop compensation in the switch-mode power converter. In yet another example, the clock signal 150 is used to determine the switching frequency of the switch-mode power converter. In one embodiment, the switch-mode power converter is an off-line power converter. In another embodiment, the power converter operates in a current mode. In yet another example, the PWM generator 160 is configured to control a switching frequency and a pulse width for a power converter.

Figure 2:
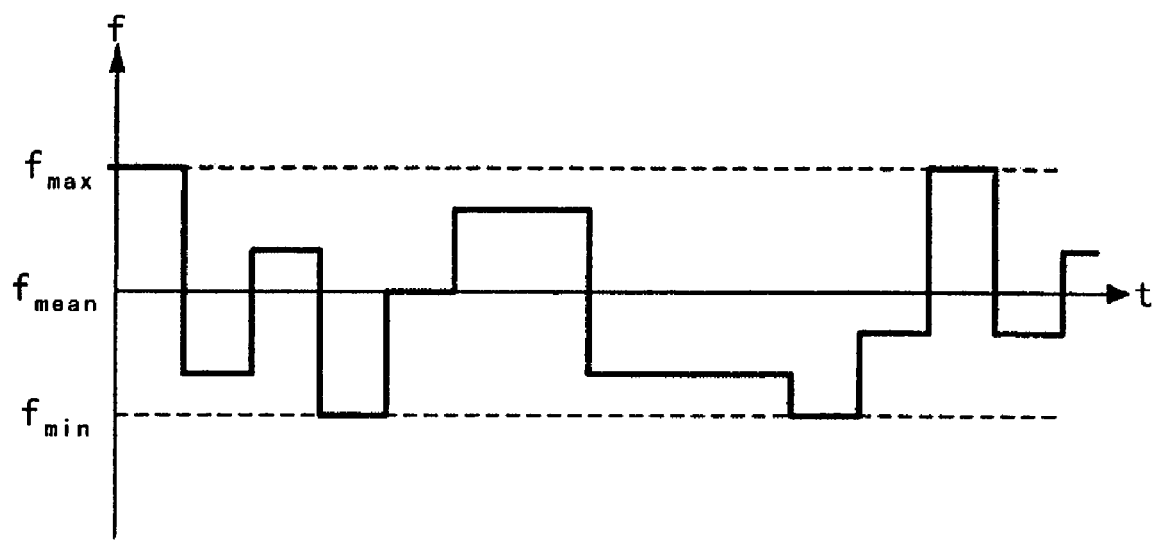
FIG. 2 is a simplified diagram showing frequency variations according to an embodiment of the present invention.

FIG. 2 is a simplified diagram showing frequency variations according to an embodiment of the present invention. This diagram is merely an example, which should not unduly limit the scope of the claims. One of ordinary skill in the art would recognize many variations, alternatives, and modifications. As shown in FIG. 2, the frequency f changes over time t. For example, the frequency f varies between a maximum frequency $f_{max}$ and a minimum frequency $f_{min}$ around a mean frequency $f_{mean}$. For example, the frequency modulation index $M_F$ is defined as follows:

$$M_f = \frac{f_{max} - f_{min}}{f_{max} + f_{min}} \quad \text{(Equation 1)}$$

For example, the difference between $f_{max}$ and $f_{min}$ is determined by the magnitude of the control signal 132 generated by the pseudorandom signal generator 110 and the N-bit D/A converter 120. In one embodiment, the frequency f represents the frequency of the clock signal 150 generated by the signal generator 140. In another embodiment, the frequency f represents a switching frequency of the switch-mode power converter controlled by the PWM generator 160. Accordingly, the electromagnetic interference (EMI) power is spread in a frequency range instead of a single frequency $f_{mean}$ according to an embodiment of the present invention.

Figure 3:
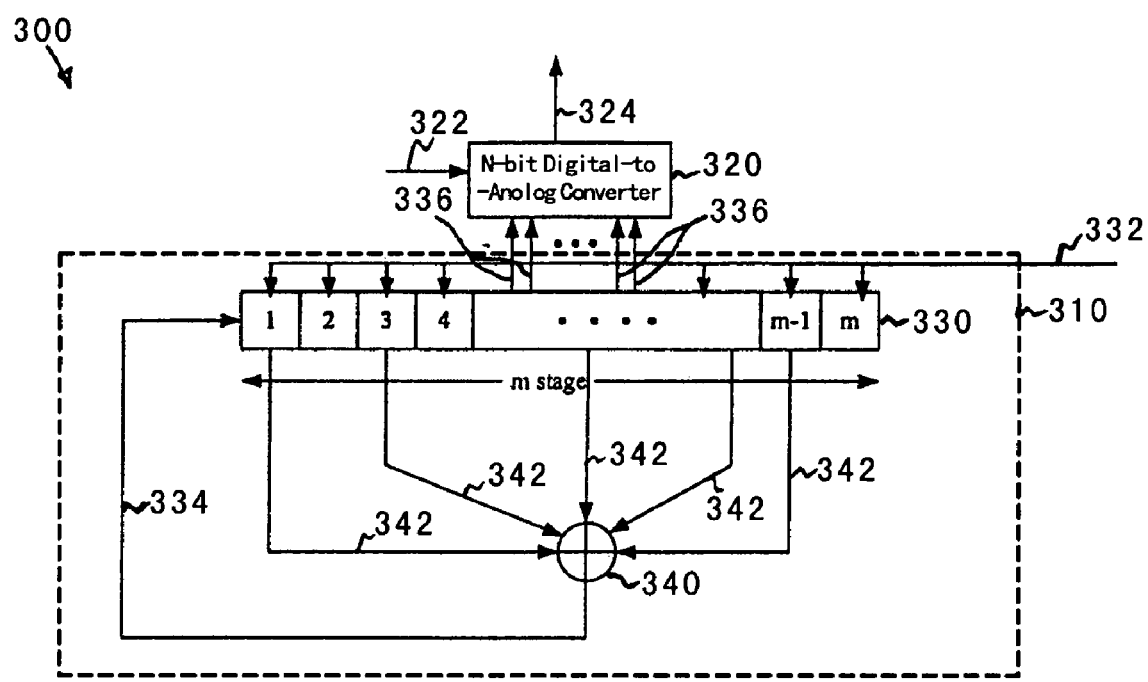
FIG. 3 is a simplified diagram for frequency variation generator according to an embodiment of the present invention.

FIG. 3 is a simplified diagram for frequency variation generator according to an embodiment of the present invention. This diagram is merely an example, which should not unduly limit the scope of the claims. One of ordinary skill in the art would recognize many variations, alternatives, and modifications. A system 300 includes an m-stage M-sequence generator 310 and an N-bit digital-to-analog (D/A) converter 320. Although the above has been shown using a selected group of components for the system 300, there can be many alternatives, modifications, and variations. For example, some of the components may be expanded and/or combined. Other components may be inserted to those noted above. Depending upon the embodiment, the arrangement of components may be interchanged with others replaced. For example, the m-stage M-sequence generator 310 is replaced by another type of pseudorandom signal generator. Further details of these components are found throughout the present specification and more particularly below.

The m-stage M-sequence generator 310 includes a linear feedback shift register 330 and a logic component 340. For example, the m-stage M-sequence generator can provide the maximum length pseudo-random number for a given m-stage and maximize the randomization. The linear shift register 330 includes flip-flops 1, 2, ..., m−1, and m, and receives a clock signal 332. m is a positive integer. In response to the clock signal 332, the datum stored in a flip-flop is replaced by the datum transferred from the flip-flop at an earlier stage. For example, the datum stored in flip-flop 1 is transferred to flip-flop 2, the datum stored in flip-flop 2 is transferred to flip-flop 3, ..., and the datum stored in flip-flop m−1 is transferred to flip-flop m. Additionally, the datum stored in flip-flop 1 is replaced by an datum represented by an output signal 334 generated by the logic component 340.

The logic component 340 receives input signals 342 from selected flip-flops of the linear shift register 330. For example, the logic component 340 includes a processing device. Each input signal represents a datum stored in the corresponding flip-flop. The input signals are processed according to a predetermined logic, and the logic component generates the output signal 334. In one embodiment, the logic component 340 includes an exclusive OR (XOR) gate.

The N-bit digital-to-analog (D/A) converter 320 receives a digital signal. N is a positive integer. The digital signal includes signals 336, each of which represents the datum stored in one of N flip-flops. The N flip-flops are selected from the flip-flops of the linear shift register 330. The digital signal received by the D/A converter 320 represents an N-bit binary datum. Each bit represents the datum stored in one of the N flip-flops. Additionally, the D/A converter 320 receives a reference signal 322. The reference signal 322 is used to determine a maximum signal level $S_{max}$ and a minimum signal level $S_{min}$. In response to the received digital signal, the D/A converter 320 generates an output signal 324. The output signal 324 ranges from $S_{min}$ to $S_{max}$. For example, the output signal 324 is in the voltage domain. In another example, the output signal 324 is in the current domain.

The system 300 has various applications. In one embodiment, the system 300 is used for the system 100. For example, the m-stage M-sequence generator 310 is the m-stage M-sequence generator 110. The D/A converter 320 is the D/A converter 120. The clock signal 332 is the clock signal 150, and the output signal 324 is the control signal 132. For example, the maximum signal level $S_{max}$ and the minimum signal level $S_{min}$ correspond to the maximum frequency $f_{max}$ and the minimum frequency $f_{min}$ respectively.

Figure 4:
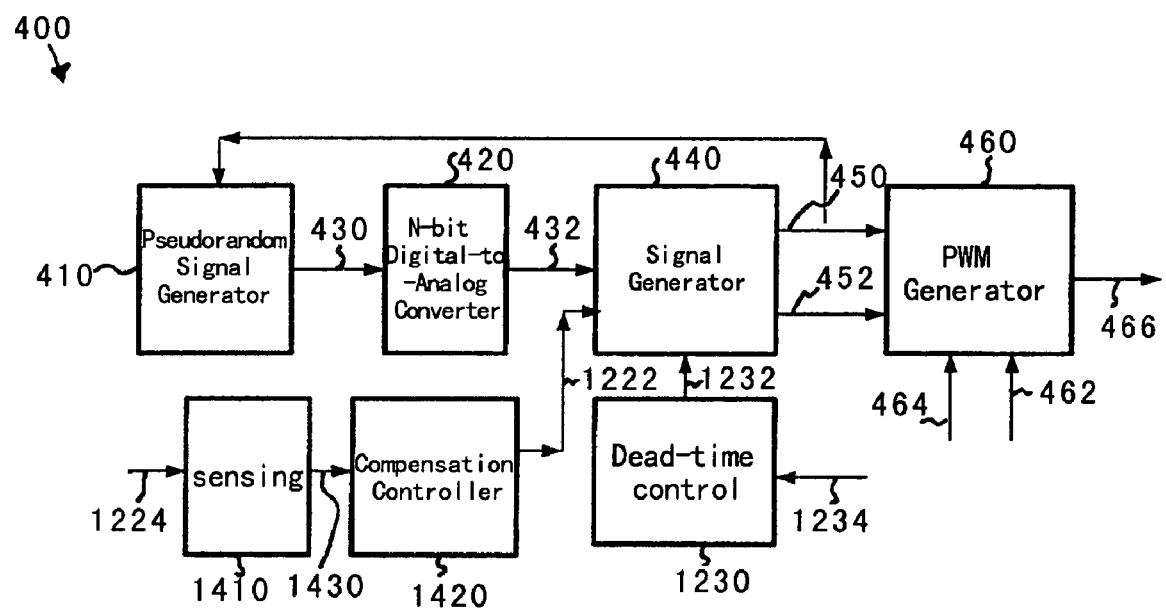
FIG. 4 is a simplified system for controlling frequency variation according to another embodiment of the present invention.

FIG. 4 is a simplified system for controlling frequency variation according to another embodiment of the present invention. This diagram is merely an example, which should not unduly limit the scope of the claims. One of ordinary skill in the art would recognize many variations, alternatives, and modifications. A system 400 includes a pseudorandom signal generator 410, an N-bit digital-to-analog converter 420, a signal generator 440, a pulse-width-modulation (PWM) generator 460, a sensing system 1410, a compensation controller 1420, and a dead-time controller 1230. Although the above has been shown using a selected group of components for the system 400, there can be many alternatives, modifications, and variations. For example, some of the components may be expanded and/or combined. Other components may be inserted to those noted above. Depending upon the embodiment, the arrangement of components may be interchanged with others replaced. For example, the PWM generator 460 is replaced by another component receiving at least an output signal of the signal generator 440. Further details of these components are found throughout the present specification and more particularly below.

The pseudorandom signal generator 410 outputs a digital signal 430 to the N-bit digital-to-analog (D/A) converter 420. For example, the pseudorandom signal generator includes an m-stage M-sequence generator. m is a positive integer. In another example, N is a positive integer. The D/A converter 420 generates a control signal 432 based on the digital signal 430. In one embodiment, the control signal 432 is in the current domain. In another embodiment, the control signal is in the voltage domain. For example, the control signal 432 is modulated by the digital signal 430. In another example, the control signal 432 is a pseudorandom signal. In yet another example, the pseudorandom signal generator 410 and the N-bit D/A converter 420 form a clock randomizer.

The control signal 432 is received by the signal generator 440. Additionally, the signal generator 440 receives control signals 1222 and 1232 from the compensation controller 1420 and the dead-time controller 1230 respectively. For example, the signal generator 440 is an output signal generator. The signal generator 440 outputs a clock signal 450 and a ramping signal 452 based on the control signals 432, 1222 and 1232. In one embodiment, the signal generator 440 includes an oscillator. For example, the oscillator is a voltage controlled oscillator (VCO). In another example, the oscillator is a current controlled oscillator (ICO). The oscillation frequency is modulated with respect to time by the control signal 432. For example, the oscillation frequency is randomized around a mean frequency for a predetermined time period.

The clock signal 450 and the ramping signal 452 are received by the PWM generator 460. Additionally, the clock signal 450 is also received by the pseudorandom signal generator 410. In one embodiment, the PWM generator 460 also receives a voltage feedback signal 462 and a current sensing signal 464, and generates a PWM signal 466. For example, the PWM signal 466 is used to turn on or off a power switch in a switch-mode power converter. In another example, the ramping signal 452 is used for slop compensation in the switch-mode power converter. In yet another example, the clock signal 450 is used to determine the switching frequency of the switch-mode power converter. In one embodiment, the switch-mode power converter is an off-line power converter. In another embodiment, the power converter operates in a current mode.

The dead-time controller 1230 receives a load signal 1234 and generates the control signal 1232. The load signal 1234 represents the level of output load for the switch-mode converter. For example, the load signal 1234 includes a control voltage which increases with the output load. As another example, the load signal 1234 is generated by a feedback loop. In response to the load signal 1234, the dead-time controller 1230 outputs the control signal 1232 to the signal generator 440. The signal generator 440 uses the control signal 1232 to perform frequency control.

The sensing system 1410 receives an input voltage 1224 and generates a control signal 1430. The control signal 1430 represents the magnitude of the input voltage 1224. In one embodiment, the control signal 1430 is in the current domain. In another embodiment, the control signal 1430 is in the voltage domain. The control signal 1430 is received by the compensation controller 1420, which generates the control signal 1222 in response.

The control signal 1222 is received by the signal generator 440. For example, the signal generator 440 includes an oscillator. In another example, the signal generator 440 outputs the ramping signal 452 whose slope of signal strength as a function of time is adjusted based on the control signal 1222. Additionally, the signal generator 440 outputs the clock signal 450. For example, the clock signal 450 has the same frequency as the ramping signal 452. In another example, the clock signal 450 is used by the PWM generator 460 to control switching frequency of the switch-mode power converter.

As discussed above, the frequency of the clock signal 450 is controlled by the control signal 432 generated by the N-bit digital-to-analog converter 420 and the control signal 1232 generated by the dead-time controller 1230 respectively. For example, the control signal 432 determines the mean frequency of the clock signal 450, and the control signal 1232 determines the frequency variations of the clock signal 450 as shown in FIG. 2.

Figure 5:
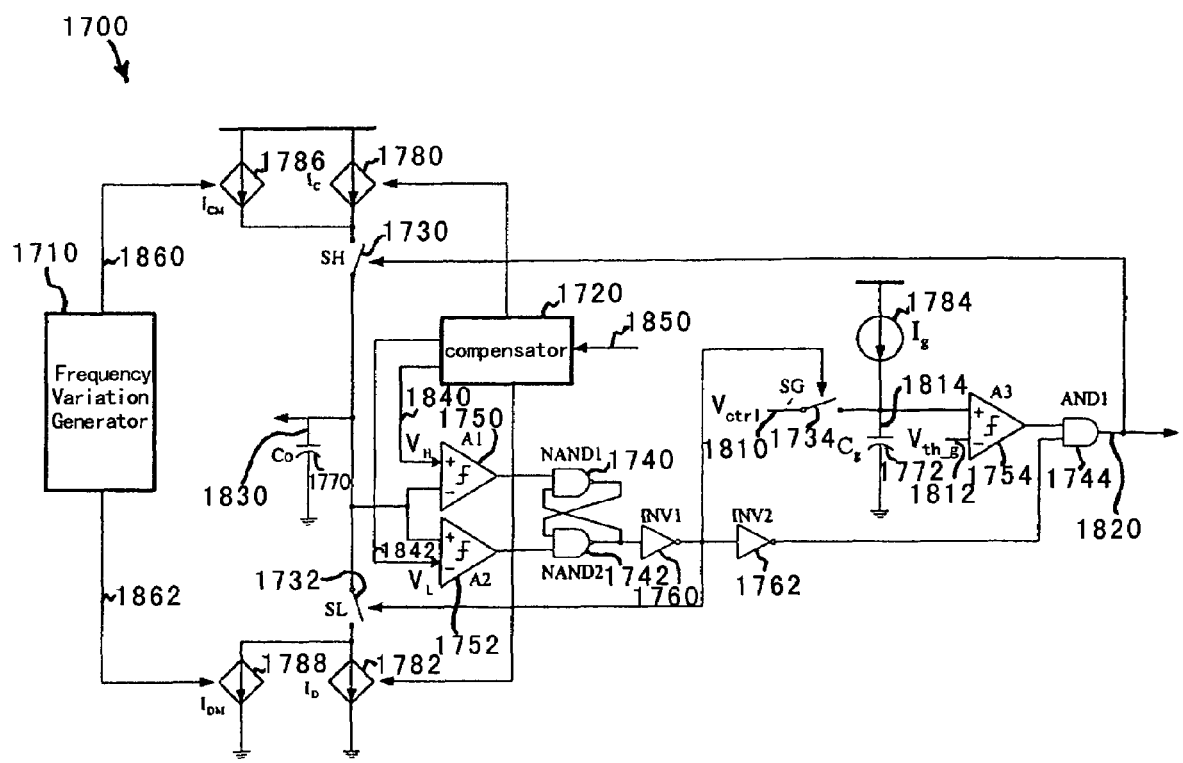
FIG. 5 is a simplified system for frequency control according to another embodiment of the present invention.

FIG. 5 is a simplified system for frequency control according to another embodiment of the present invention. This diagram is merely an example, which should not unduly limit the scope of the claims. One of ordinary skill in the art would recognize many variations, alternatives, and modifications. A system 1700 includes a frequency variation generator 1710, a compensator 1720, switches 1730, 1732 and 1734, NANDs 1740 and 1742, AND 1744, comparators 1750, 1752 and 1754, inverters 1760 and 1762, capacitors 1770 and 1772, current sources 1780, 1782, 1784, 1786 and 1788. Although the above has been shown using a selected group of components for the system 1700, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The capacitor 1770 is charged or discharged through the switch 1730 (SH) or the switch 1732 (SL) respectively. Between the discharging phase ($T_{off}$) and the charging phase ($T_{on}$), a dead time $T_{dead}$ can be inserted between $T_{on}$ and $T_{off}$ by keeping both switches 1730 and 1732 open. The outputs of comparators 1750 (A1) and 1752 (A2) are latched by an RS flip-flop. The RS flip-flop includes the NANDs 1740 (NAND1) and 1742 (NAND2). The comparators 1750 (A1) and 1752 (A2) are voltage clamping comparators with threshold voltages 1840 ($V_H$) and 1842 ($V_L$) respectively. The voltage 1830 at one terminal of the capacitor 1770 has a voltage range that is equal to the difference between the threshold voltages 1842 and 1840.

The capacitor 1772 ($C_g$), the current source 1784 ($I_g$), the switch 1734 (SG), and the comparator 1754 (A3) are used for dead-time modulation. If a control voltage 1810 ($V_{ctrl}$) is smaller than a threshold voltage ($V_{th\_g}$), a voltage 1814 at one terminal of the capacitor 1772 begins to rise from the control voltage 1810 to the threshold voltage 1812 after a discharging phase ($T_{off}$) ends for the capacitor 1770 ($C_0$). For example, the rise of the voltage 1814 is supported by the current source 1784. At the end of the discharging period, the switch 1734 becomes open.

When the voltage 1814 reaches the threshold voltage 1812, a signal 1820 generated by the AND 1744 (AND1) is used to close the switch 1730 (SH). Subsequently, the voltage 1830 for the capacitor 1770 starts to rise, and the charging phase ($T_{on}$) begins. In one embodiment, the dead time $T_{dead}$ is the period when the switches 1730 and 1732 are both open. During the dead time, the voltage 1830 is kept constant over time.

As shown in FIG. 5, the dead time $T_{dead}$ is proportional to the difference between the threshold voltage ($V_{th\_g}$) and the control voltage 810 ($V_{ctrl}$) if $V_{ctrl}$ is less than $V_{th\_g}$. For example, $T_{dead}$ increases with decreasing $V_{ctrl}$ if $V_{ctrl}$ is less than $V_{th\_g}$. The oscillation frequency of the voltage 1830 decreases with decreasing $V_{ctrl}$. For example, the control voltage 1810 ($V_{ctrl}$) represents the level of output load for the switch-mode converter. In another example, $V_{ctrl}$ increases with the output load. In yet another example, $V_{ctrl}$ is generated by a feedback loop. If $V_{ctrl}$ is greater than or equal to $V_{th\_g}$, the dead time $T_{dead}$ equals to zero.

In another embodiment, $V_{th\_g}$ corresponds a threshold output load, and $V_{ctrl}$ varies with the output load. For example, $V_{ctrl}$ increases with the output load. As shown in FIG. 5, $T_{dead}$ increases with the decreasing output load if the output load is less than the threshold output load. For example, $T_{dead}$ increases with the decreasing output load if the output load is less than the threshold output load but more than another threshold output load. If the output load is more than or equal to the threshold output load, the dead time $T_{dead}$ equals to zero.

In yet another embodiment, the charging time $T_{on}$ and the discharging time $T_{off}$ each are constant with respect to $V_{ctrl}$. For example, $V_{ctrl}$ varies with the output load. The charging time $T_{on}$ and the discharging time $T_{off}$ each are constant with respect to output load.

In yet another embodiment, time periods for charging phase, discharging phase, and dead time phase are determined as follows:

$$T_{on} = \frac{(V_H - V_L) \times C_O}{I_C + I_{CM}} \quad \text{(Equation 2)}$$

$$T_{off} = \frac{(V_H - V_L) \times C_O}{I_D + I_{DM}} \quad \text{(Equation 3)}$$

$$T_{dead} = \frac{(V_{th\_g} - V_{ctrl}) \times C_g}{I_g} \text{ if } V_{th\_g} > V_{ctrl} \quad \text{(Equation 4)}$$

$$T_{dead} = 0 \text{ if } V_{th\_g} \leq V_{ctrl} \quad \text{(Equation 5)}$$

where $T_{on}$, $T_{off}$, and $T_{dead}$ are time periods for charging phase, discharging phase, and dead-time phase respectively. $T_{on}$ depends on the sum of current sources 1780 ($I_C$) and 1786 ($I_{CM}$) and the difference between the threshold voltages 1840 ($V_H$) and 1842 ($V_L$). $T_{off}$ depends on the sum of current sources 1782 ($I_D$) and 1788 ($I_{DM}$). For example, the current sources 1786 ($I_{CM}$) and 1788 ($I_{DM}$) are voltage controlled current source. Additionally, the frequency $F_S$ of the voltage 1830 is defined as follows:

$$F_S = \frac{1}{T_{on} + T_{off} + T_{dead}} \quad \text{(Equation 6)}$$

As shown in FIG. 5, the current sources 1786 ($I_{CM}$) and 1788 ($I_{DM}$) are modulated by control signals 1860 and 1862 from the frequency variation generator 1710. The frequency $F_S$ is modulated by the frequency variation generator 1710 if $V_{th\_g} \leq V_{ctrl}$. If $V_{th\_g} > V_{ctrl}$, the frequency $F_S$ is modulated by the frequency variation generator 1710 and the components used for dead time control.

In one embodiment, the control signals 1860 and 1862 each represent a pseudorandom signal. Accordingly, the current sources 1786 ($I_{CM}$) and 1788 ($I_{DM}$) are controlled by the pseudorandom signals. Based on Equations 2-6, the switching frequency of the switch-mode power converter is modulated by the pseudorandom signals.

In one embodiment, the frequency variation generator 1710 includes the pseudorandom signal generator 110 and the N-bit digital-to-analog converter 120 as shown in FIG. 1. In another embodiment, the frequency variation generator 1710 includes the m-stage M-sequence generator 310 and the N-bit digital-to-analog converter 320 as shown in FIG. 3. In yet another embodiment, the frequency variation generator 1710 includes the pseudorandom signal generator 410 and the N-bit digital-to-analog converter 420 as shown in FIG. 4.

The current sources 1780 ($I_C$) and 1782 ($I_D$), and the threshold voltages 1840 ($V_H$) and 1842 ($V_L$) are modulated by the compensator 1720. The compensator 1720 receives an input voltage 1850. As shown in FIG. 5, the voltage 1830 increases with time at a slope during the charging phase ($T_{on}$), and decreases with time at another slope during the discharging phase ($T_{off}$). Both slopes vary with the input voltage 1850. For example, the slopes vary with the input voltage 1850 within a predetermined voltage range. In another example, the slopes are constant with respect to the control voltage 1810 ($V_{ctrl}$), but vary with respect to the input voltage 1850.

As discussed above and further emphasized here, FIG. 5 is merely an example, which should not unduly limit the scope of the claims. One of ordinary skill in the art would recognize many variations, alternatives, and modifications. In one embodiment, the voltage 1830 is used as a ramping signal, and the signal 1820 is used as a clock signal. For example, the ramping signal and the clock signal are received by a PWM generator. The PWM generator uses the ramping signal to provide slope compensation. For example, the slope compensation ratio is constant regardless of the input voltage 1850. Additionally, the PWM generator uses the clock signal to control switching frequency.

As discussed above, the frequency $F_S$ is modulated by varying the current sources 1786 ($I_{CM}$) and 1788 ($I_{DM}$) with the control signals 1860 and 1862. The current sources 1786 ($I_{CM}$) and 1788 ($I_{DM}$) also affect the slop of the voltage 1830. For example, the voltage 1830 is used as a ramping signal to provide slope compensation. If the frequency modulation is small, effect of the slop change on loop stability is negligible.

In another embodiment, the system 1700 is used as the system 400. For example, the voltage 1830 is the ramping signal 452, and the signal 1820 is the clock signal 450. In another example, the compensator 1720 includes the sensing system 1410 and the compensation controller 1420. In yet another example, the control voltage 1810 is the load signal 1234. In yet another example, the input voltage 1850 is the input voltage 1224. In yet another embodiment, at least part of the system 1700 is used as the system 100. For example, the voltage 1830 is the ramping signal 152, and the signal 1820 is the clock signal 150. In yet another embodiment, the system 100, 300, or 1700 is a part of the power converter.

According to yet another embodiment of the present invention, a method for providing frequency control to a power converter includes generating a digital signal. The digital signal is associated with at least an N-bit datum, and N is a positive integer. Additionally, the method includes receiving the digital signal, processing information associated with the digital signal, and generating a first control signal based on at least information associated with the digital signal. The first control signal is an analog signal. Moreover, the method includes receiving the first control signal, processing information associated with the first control signal, and generating at least a first output signal related to a frequency based on at least information associated with the first control signal. The N-bit datum represents a pseudorandom number. For example, the method can be performed by the system 100, 300, 400, and/or 1700.

According to yet another embodiment of the present invention, a method for providing a pseudorandom signal includes receiving a plurality of signals from a shift register, processing information associated with the plurality of signals, and generating a first input signal based on at least information associated with the plurality of signals. Additionally, the method includes receiving the first input signal and a second input signal by the shift register, processing information associated with the first input signal and the second input signal, and generating a digital signal based on at least information associated with the first input signal and the second input signal by an M-sequence process. For example, the m-stage M-sequence generator can provide the maximum length pseudo-random number for a given m-stage and maximize the randomization. Moreover, the method includes processing information associated with the digital signal, and generating an analog signal related to a signal strength based on at least information associated with the digital signal. The digital signal represents at least an N-bit datum, and N is a positive integer. The N-bit datum represents a pseudorandom number. For example, the method can be performed by the system 100, 300, 400, and/or 1700.

The present invention has various advantages. Some embodiments of the present invention can reduce electromagnetic interference of a switch-mode power converter. For example, the switch-mode converter is an off-line power converter. Certain embodiments of the present invention provide switching frequency variations to a switch-mode power converter. Some embodiments of the present invention avoid a strong single tone at a fixed frequency and the harmonics in a switch-mode power converter. Certain embodiments of the present invention can spread the electromagnetic interference power within a frequency range for a switch-mode power converter. For example, the randomization of the switching frequency can make the EMI power spectrum substantially uniform in a frequency band around a mean switching frequency and the high order harmonics. Some embodiments of the present invention provide frequency variations according to a frequency modulation index $M_f$. For example, the frequency modulation index $M_f$ is determined by the EMI requirement of the switch-mode power converter.

Certain embodiments of the present invention use a digital circuit for frequency variation. The digital circuit is portable, and can be easily migrated for different integrated circuit manufacturing processes. Some embodiments of the present invention provide frequency variations to a clock signal by a pseudorandom signal. For example, the pseudorandom signal is a M-sequence signal. Certain embodiments of the present invention use a frequency variation controller including an m-stage M-sequence generator and an N-bit digital-to-analog converter. For example, the m-stage M-sequence generator includes an m-stage linear shift register. In another example, the digital-to-analog converter operates either in the voltage mode or the current mode. In yet another example, the output of the digital-to analog converter is used to control frequency variations of an oscillator in a switch-mode power converter. In yet another example, the clock signal generated by the oscillator is fed into the linear shift register.

Some embodiments of the present invention use an oscillator controlled by voltage or current signals. For example, the control signals are generated by a frequency variation generator and/or a dead-time controller. In another example, the oscillator generates a clock signal and a ramping signal. The clock signal and the ramping signal do not have a constant frequency. The frequency is randomized and shuffled over time. In yet another example, the charge and discharge current in the oscillator is modulated by a pseudorandom signal. The modulated charge and discharge current determine the oscillation frequency and hence the switching frequency in the switch-mode power converter.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for providing frequency control, the system comprising:
    a pseudorandom signal generator configured to generate a digital signal, the digital signal associated with at least an N-bit datum, N being a positive integer;
    a digital-to-analog converter configured to receive the digital signal and generate a first control signal;
    an output signal generator configured to receive the first control signal and generate at least a first output signal associated with a frequency;
    a pulse-width-modulation generator configured to receive at least the first output signal; and
    a first controller configured to receive a load signal and output a second control signal to the output signal generator, the load signal indicating an output load;
    wherein:
        the N-bit datum represents a pseudorandom number; and
        the output signal generator is further configured to process information associated with the first control signal and the second control signal and generate at least the first output signal associated with the frequency based on at least information associated with the first control signal and the second control signal.

2. The system of claim 1 wherein
    the pseudorandom signal generator includes an m-stage M-sequence generator, m being a positive integer; and
    the m-stage M-sequence generator is configured to receive the first output signal.

3. The system of claim 1 wherein:
    the first output signal is associated with a first signal strength;
    the frequency is inversely proportional to a first time period and a second time period; and
    the first signal strength during a first time period is different from the first signal strength during the second time period.

4. The system of claim 1 wherein the output signal generator is configured to change the frequency with respect to time within a predetermined frequency range.

5. The system of claim 4 wherein the frequency is associated with a mean frequency for a predetermined time period.

6. The system of claim 1 wherein the first control signal includes a pseudorandom signal.

7. The system of claim 6 wherein the output signal generator is further configured to change the frequency with respect to time based on at least information associated with the pseudorandom signal.

8. The system of claim 7 wherein the frequency changes randomly with respect to time.

9. The system of claim 1 wherein the first control signal is in at least one domain selected from a group consisting of a voltage domain and a current domain.

10. The system of claim 1 wherein the pulse-width-modulation generator is configured to control a switching frequency and a pulse width based on at least information associated with the first output signal.

11. The system of claim 1 wherein:
the frequency changes with respect to time; and
the frequency is associated with a mean frequency.

12. The system of claim 11 wherein the output signal generator is further configured to determine the mean frequency based on at least information associated with the second control signal.

13. The system of claim 1, and further comprising a compensation system configured to receive an input signal and generate a third control signal.

14. The system of claim 13 wherein:
the output signal generator is further configured to receive the third control signal and generate a second output signal associated with a slope; and
wherein the generate a second output signal includes determine the slope based on at least information associated with the third control signal.

15. The system of claim 14 wherein the pulse-width-modulation generator uses the second output signal to perform a slope compensation for a feedback loop.

16. The system of claim 15 wherein the slope compensation is associated with a slope compensation ratio, the slope compensation ratio being constant with respect to the input signal.

17. The system of claim 13 wherein the compensation system comprises:
a sensing system configured to receive the input signal and generate a fourth control signal; and
a compensation controller configured to receive the fourth control signal and output the third control signal.

18. A system for providing a pseudorandom signal, the system comprising:
a shift register configured to receive a first input signal and a second input signal and generate a digital signal, the shift register including m flip-flops, m being a positive integer;
a processing device configured to receive a plurality of signals and generate the first input signal, the plurality of signals representing data stored in a plurality of flip-flops respectively, the plurality of flip-flops being selected from the m flip-flops;
a digital-to-analog converter configured to receive the digital signal and generate an analog signal associated with a signal strength, the digital-to-analog converter being further configured to receive a control signal, process information associated with the digital signal and the control signal, and determine a first range for the signal strength based on at least information associated with the digital signal and the control signal;
an output signal generator configured to receive the analog signal and generate at least an output signal associated with a frequency; and
a pulse-width-modulation generator configured to receive at least the output signal;
wherein:
the digital signal represents at least an N-bit datum, N being a positive integer;
the N-bit datum corresponds to N flip-flops, the N flip-flops being selected from the m flip-flops; and
the output signal and the second input signal are the same.

19. The system of claim 18 wherein the processing device is configured to perform an exclusive-OR operation.

20. The system of claim 18 wherein the frequency changes within a second range, the second range corresponding to the first range.

21. A method for implementation in an electronic circuit for providing frequency control, the method comprising:
generating a digital signal, the digital signal associated with at least an N-bit datum, N being a positive integer;
receiving the digital signal;
processing information associated with the digital signal;
generating a first control signal based on at least information associated with the digital signal, the first control signal being an analog signal;
receiving a load signal, the load signal indicating an output load;
generating a second control signal;
receiving the first control signal and the second control signal by an output signal generator;
processing information associated with the first control signal and the second control signal;
generating at least a first output signal related to a frequency based on at least information associated with the first control signal and the second control signal; and
receiving the first output signal from the output signal generator by a pulse-width-modulation generator;
wherein the N-bit datum represents a pseudorandom number.

22. The method of claim 21 wherein the generating a digital signal includes generating the digital signal based on at least information associated with the first output signal.

23. The method of claim 21 wherein:
the first output signal is associated with a signal strength;
the frequency is inversely proportional to a first time period and a second time period; and
the signal strength during a first time period is different from the signal strength during the second time period.

24. The method of claim 21 wherein the frequency changes with respect to time within a predetermined frequency range.

25. The method of claim 24 wherein the frequency is associated with a mean frequency for a predetermined time period.

26. The method of claim 21 wherein the first control signal includes a pseudorandom signal.

27. The method of claim 26 wherein the frequency changes with respect to time based on at least information associated with the pseudorandom signal.

28. The method of claim 27 wherein the frequency changes randomly with respect to time.

29. The method of claim 21, and further comprising:
processing information associated with the first output signal; and
adjusting a switching frequency based on at least information associated with the first output signal.

30. A method for providing a pseudorandom signal, the method comprising:
receiving a plurality of signals from a shift register;
processing information associated with the plurality of signals;
generating a first input signal based on at least information associated with the plurality of signals;
receiving the first input signal and a second input signal by the shift register;
processing information associated with the first input signal and the second input signal;
generating a digital signal based on at least information associated with the first input signal and the second input signal by an M-sequence process;

receiving the digital signal and a control signal by a digital-to-analog processing information associated with the digital signal and the control signal;
determining a first range for a signal strength based on at least information associated with the control signal;
generating an analog signal related to the signal strength based on at least information associated with the digital signal;
receiving the analog signal;
processing information associated with the analog signal; and
generating at least an output signal related to a frequency based on at least information associated with the analog signal;

wherein:
the digital signal represents at least an N-bit datum, N being a positive integer;
the N-bit datum represents a pseudorandom number and the output signal and the second input signal are the same.

31. The method of claim 30 wherein the generating a first input signal includes performing an exclusive-OR operation.

32. The method of claim 30 wherein the frequency changes within a second range, the second range corresponding to the first range.

\* \* \* \* \*